United States Patent [19]

Landsness et al.

[11] 4,247,814
[45] Jan. 27, 1981

[54] MAT TESTING APPARATUS

[75] Inventors: Clifford A. Landsness, Akron; Henry K. Schmitt, Uniontown, both of Ohio

[73] Assignee: The B. F. Goodrich Company, Akron, Ohio

[21] Appl. No.: 9,707

[22] Filed: Feb. 5, 1979

[51] Int. Cl.³ .............................................. G01R 31/12
[52] U.S. Cl. ...................................... 324/54; 324/51
[58] Field of Search ...................................... 324/51, 54

[56] References Cited

U.S. PATENT DOCUMENTS

| | | | |
|---|---|---|---|
| 2,942,248 | 6/1960 | Huggins | 324/54 |
| 3,321,703 | 5/1967 | Tyszewicz | 324/54 |
| 3,582,985 | 6/1971 | Farneth | 324/54 |
| 3,792,458 | 2/1974 | Smith | 324/54 |
| 3,919,635 | 11/1975 | Bowen | 324/54 |
| 3,955,136 | 5/1976 | Wiltshire | 324/54 |

Primary Examiner—Michael J. Tokar
Attorney, Agent, or Firm—Joseph Januszkiewicz

[57] ABSTRACT

A mat testing apparatus having an enclosed test chamber with a moveable electrode platen that is cooperative with a stationary electrode platen to define a clearance space therebetween to receive a portion of a mat for testing its non-conductivity to a high electrical charge. Feed means are provided to index a predetermined length of matting that is cooperative with a let-off means and a take-up roll. The take-up feed is adjusted to its increasing size to provide for change in diameter size.

6 Claims, 6 Drawing Figures

MAT TESTING APPARATUS

BACKGROUND OF THE INVENTION

This invention relates to a new and improved apparatus for testing the non-conductance of rubber matting under the application of high voltage.

Where electrical repairs are made in areas that have good conductive substances such as steel or metal, it is necessary to provide a mat that is relatively thin and lightweight on which the repairman may stand. Such mat must be portable so that it can be rolled out for use in a prescribed area and thence rerolled and carried to the next location or packed conveniently for moving to the next location. It is necessary that such matting withstand high voltage. Heretofore, such matting would be manually unrolled and small sections of the matting would be tested for its resistance to the application of a high voltage. After one section or a portion of the roll is tested, the roll is manually manipulated such as to position a new section for testing. Such process is slow and tedious. Such matting is also very useful in areas such as ship decks where there are control panels and switch gears to provide proper insulation of power stations. The present invention provides means for automatically winding and unwinding the matting to expose a predetermined length of the matting to high voltage charge. After exposure to such charge, the matting is rolled up while another length of the matting is positioned for testing.

SUMMARY OF THE INVENTION

The present invention contemplates an apparatus for applying a high voltage charge in seriatim order to successive adjacent portions of an electrical non-conductive matting such as a rubber as it unwound from a supply roll to a take-up roll. Provisions are made to overlap the testing of the successive strips or portions of the matting to assure a testing of the full length of the matting.

DETAILED DESCRIPTION

Figure 1:
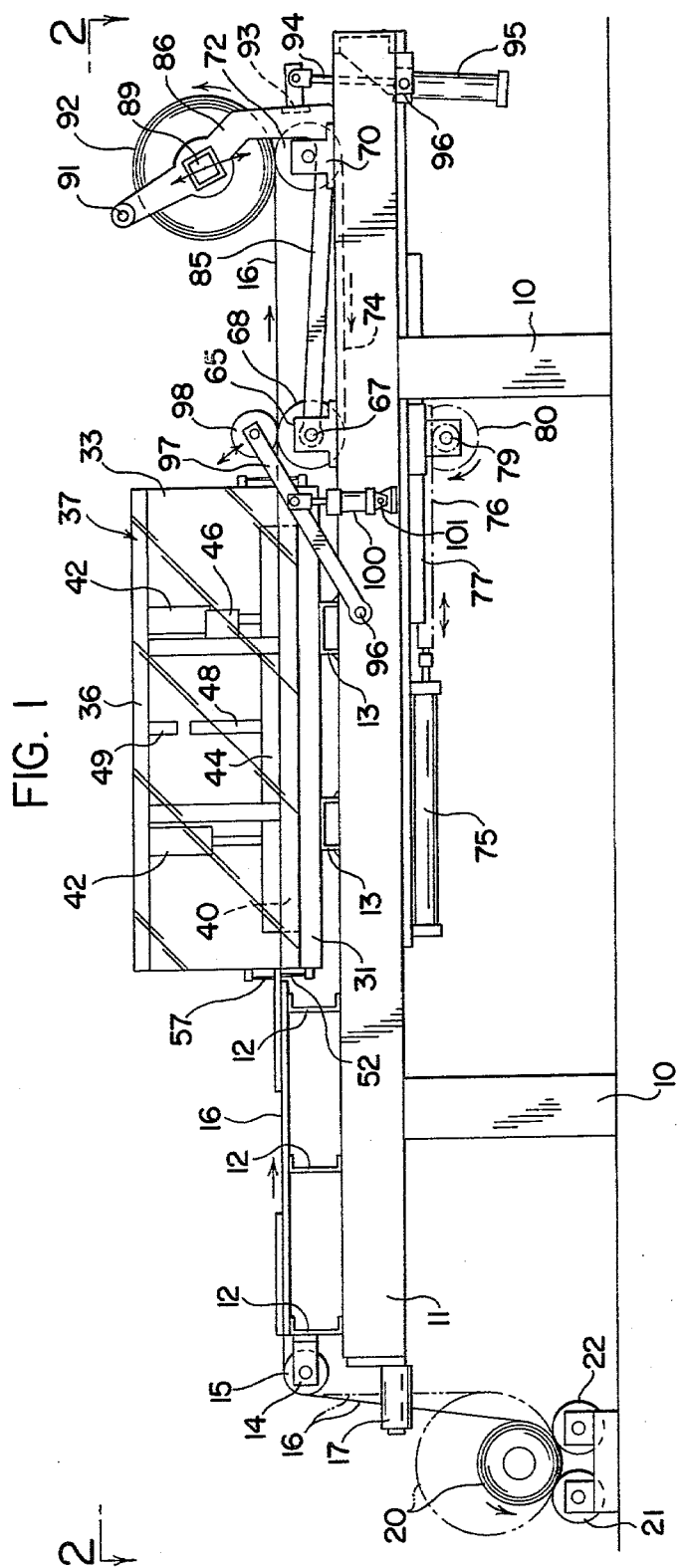
FIG. 1 is a side-elevational view of the mat testing apparatus.
Figure 2:
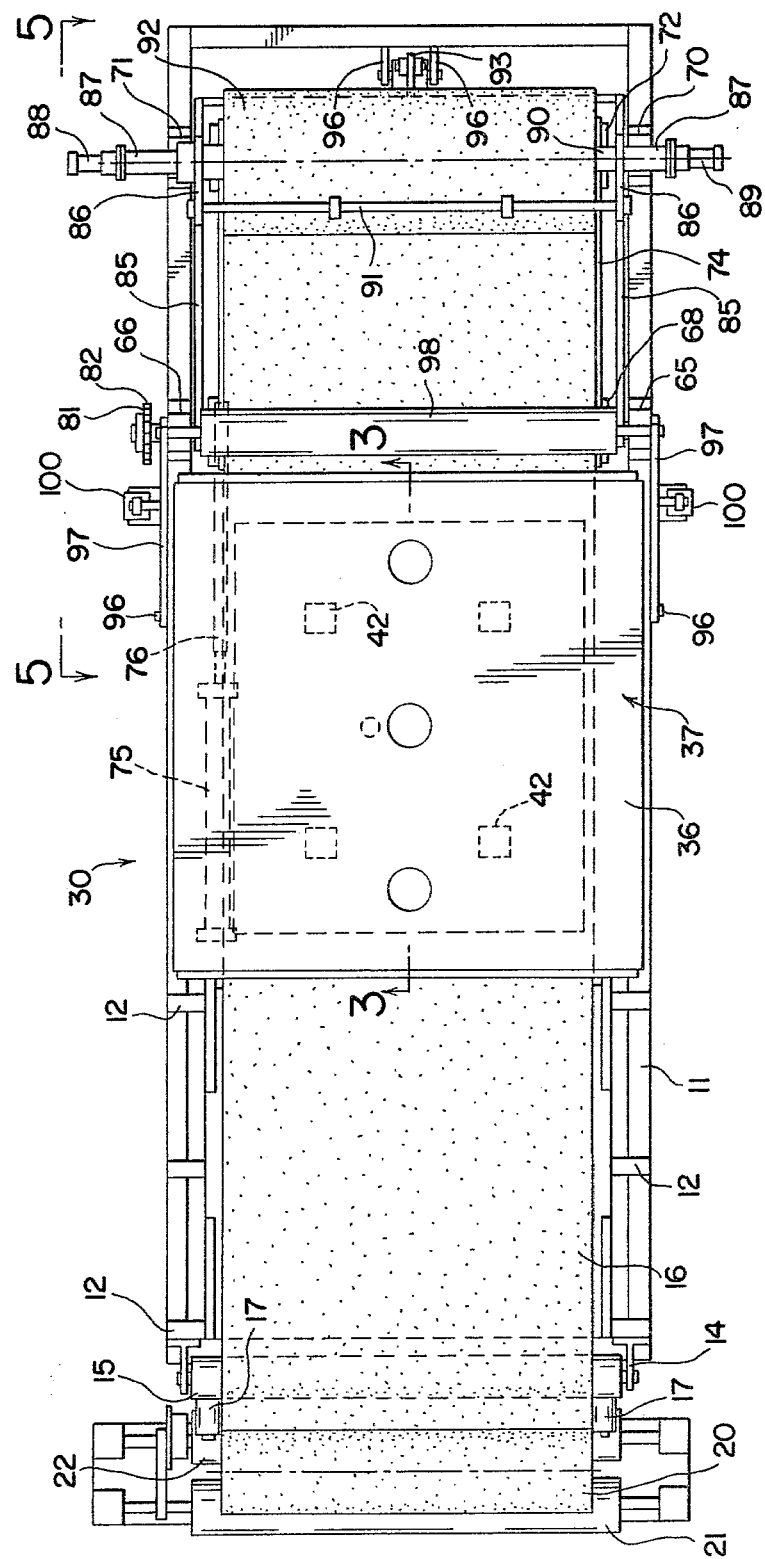
FIG. 2 is a plan view of the mat testing apparatus.

Referring to the drawings, wherein like reference numerals designate like or corresponding parts throughout the several views, there is shown in FIG. 1 a plurality of vertical supports 10 supporting brackets 11 which in turn supports cross braces 12 and channel beams 13. Mounted on one of the cross braces 12 is a pair of spaced brackets 14 journaling for rotation a guide roller 15 over which matting 16 is guided. Side guide rollers 17—17 cooperate with the guide roller 15 to guide the matting as it passes from the supply roll 20 to the high voltage testing chamber to be described. Supply roll 20 is supported by a pair of spaced idler rollers 21-22 to facilitate the unwinding of the matting as it is advanced in a manner to be described.

Figure 3:
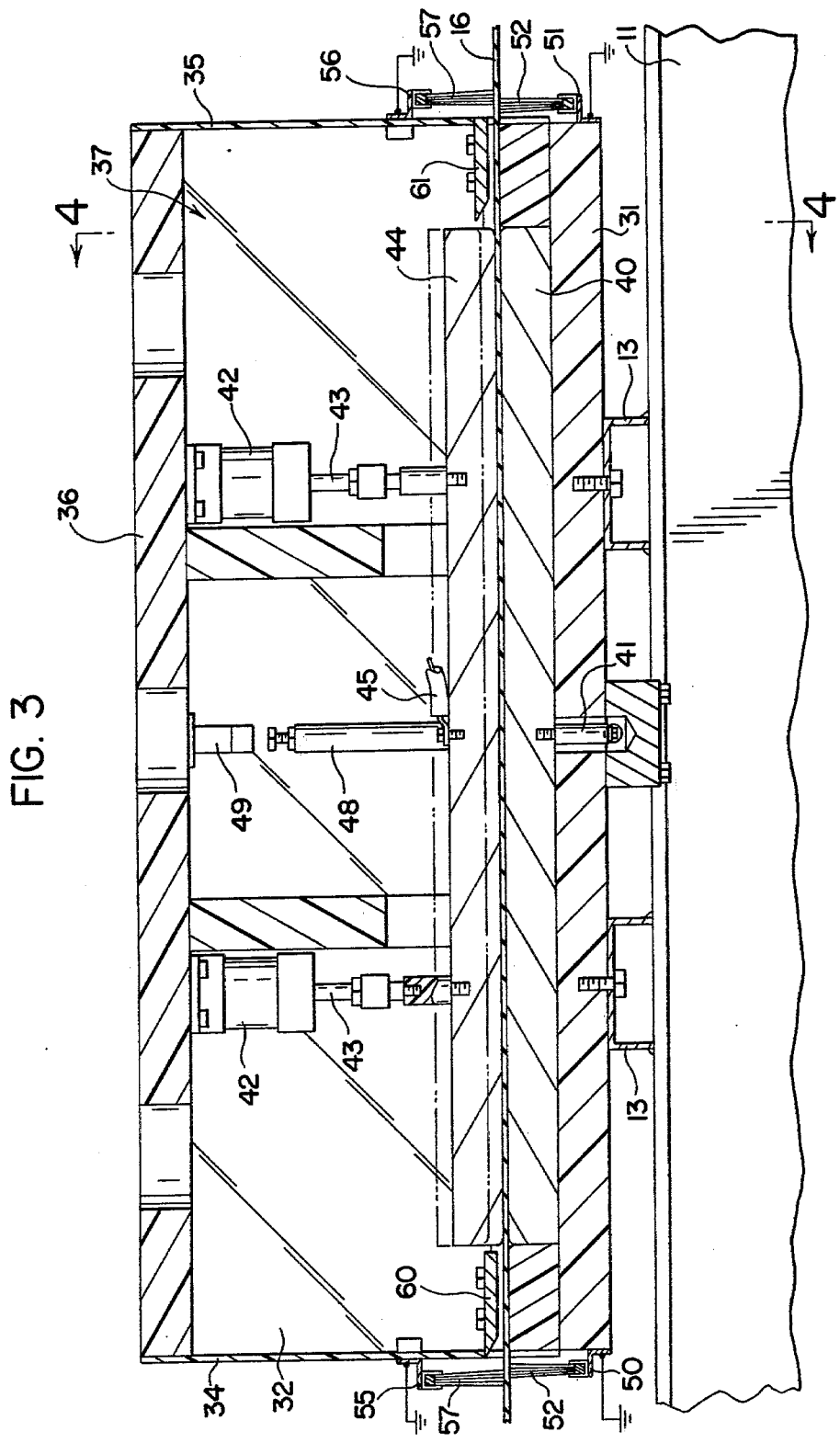
FIG. 3 is an enlarged cross sectional view of the high voltage testing chamber taken on line 3—3 of FIG. 2.
Figure 4:
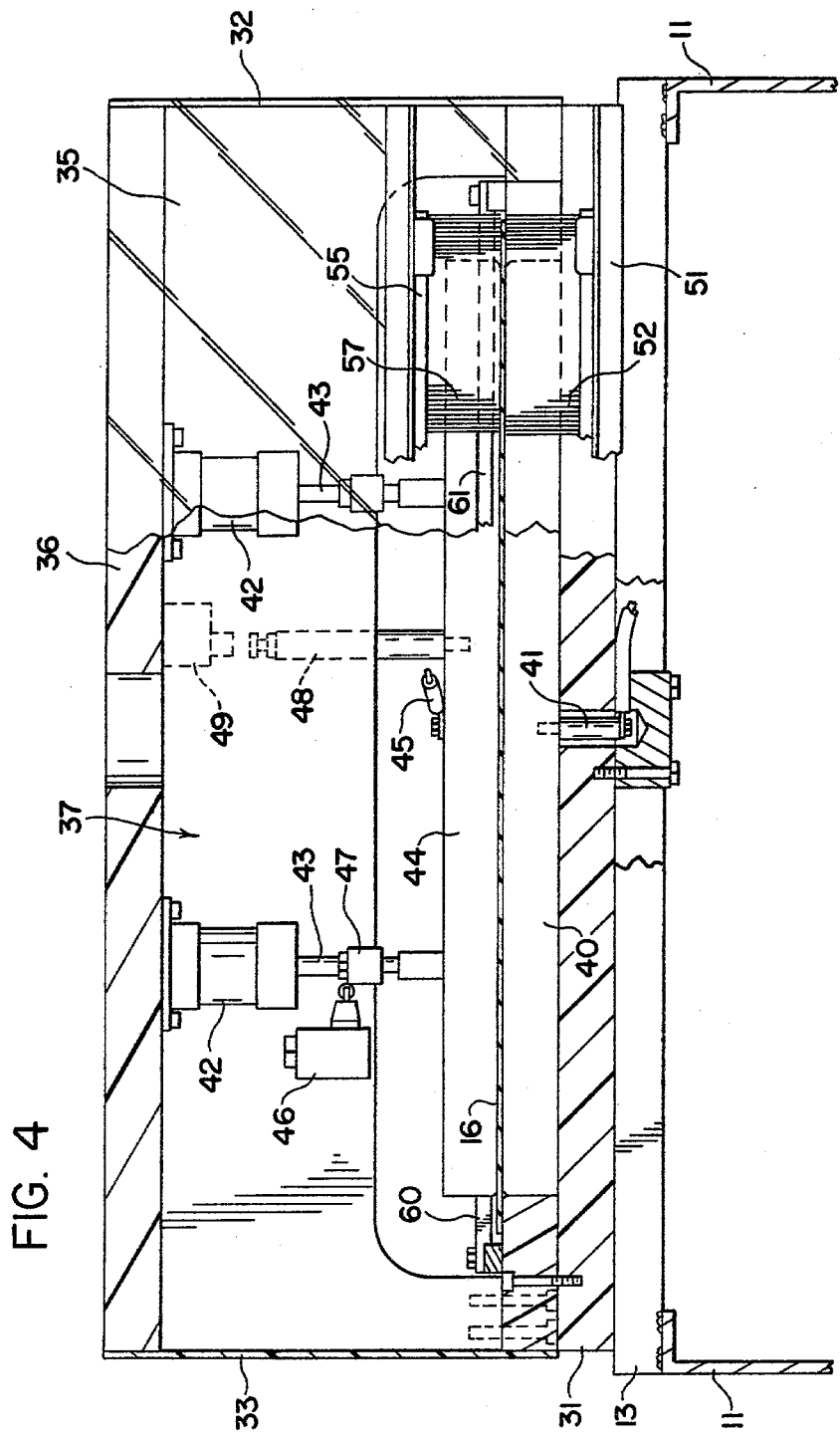
FIG. 4 is an enlarged fragmentary view of the high voltage testing chamber taken on line 4—4 of FIG. 3.

Suitably mounted on channel beams 13 is a lower plate member 31 supporting transparent side windows 32,33 and transparent end windows 34–35 such as clear polycarbonate. The upper ends of windows 32,33 34 and 35 are supported by an upper plate member 36. Plate members 31 and 36 cooperate with windows 32 through 35 to define a high voltage testing chamber 37. Plate members 31 and 36 are held in spaced relationship by suitable plates (FIGS. 1, 3 and 4). Lower plate member 31 and upper plate member 36 are made of electrical non-conductive material. Lower plate member 31 supports an electrical conductive plate or lower electrode platen or plate 40 which is grounded as by conductive member 41. A plurality of pneumatic cylinders 42 have their cylinder ends suitably connected to the upper plate member 36. The respective piston rods 43 of cylinders 42 are connected to an upper platen or electrical conductive plate 44. A suitable electrical power source for supplying a high voltage is connected to upper electrode platen or plate 44 via conductor 45. A control switch 46 is operatively connected to an adjustable abutment 47 on piston rod 43 to facilitate the sensing and control of the platen's movement. An adjustable stop 48 is mounted on upper platen 44 in alignment with a stop 49, mounted on upper plate member 36.

Lower plate member 31 has an electrically conductive bracket 50 and 51 mounted on the respective forward and rearward edge end portions thereof. Each bracket 50 and 51 supports upwardly extending metallic bristles 52. The lower portions of the respective end windows 34 and 35 have brackets 55 and 56 which support downwardly extending metallic bristles 57 which form a brush. The respective brackets 50,51,55 and 56 are grounded to prevent any static charge from building up on the matting. A beveled plate 60 and 61 (FIG. 3) is suitably mounted at the forward and rearward end portions of the test chamber 37 adjacent to end windows 34 and 35 respectively to guide the matting as it enters and leaves the test chamber 37 for guidance to the clearance space provided between platens 40 and 44. The respective end windows 34 and 35 are suitably recessed to permit the passage of matting therethrough.

Suitably mounted on brackets 11 adjacent to the discharge end of high voltage testing chamber 37 is a pair of journals 65 and 66 which receive the shaft 67 journaling for rotation roller 68. Also mounted on brackets 11 at the rearwardmost end portion of the support frame are a pair of journals 70 and 71 supporting idler roller 72. Trained about rollers 68 and 72 is an endless belt 74 to facilitate the movement of the matting for windup.

Figure 5:
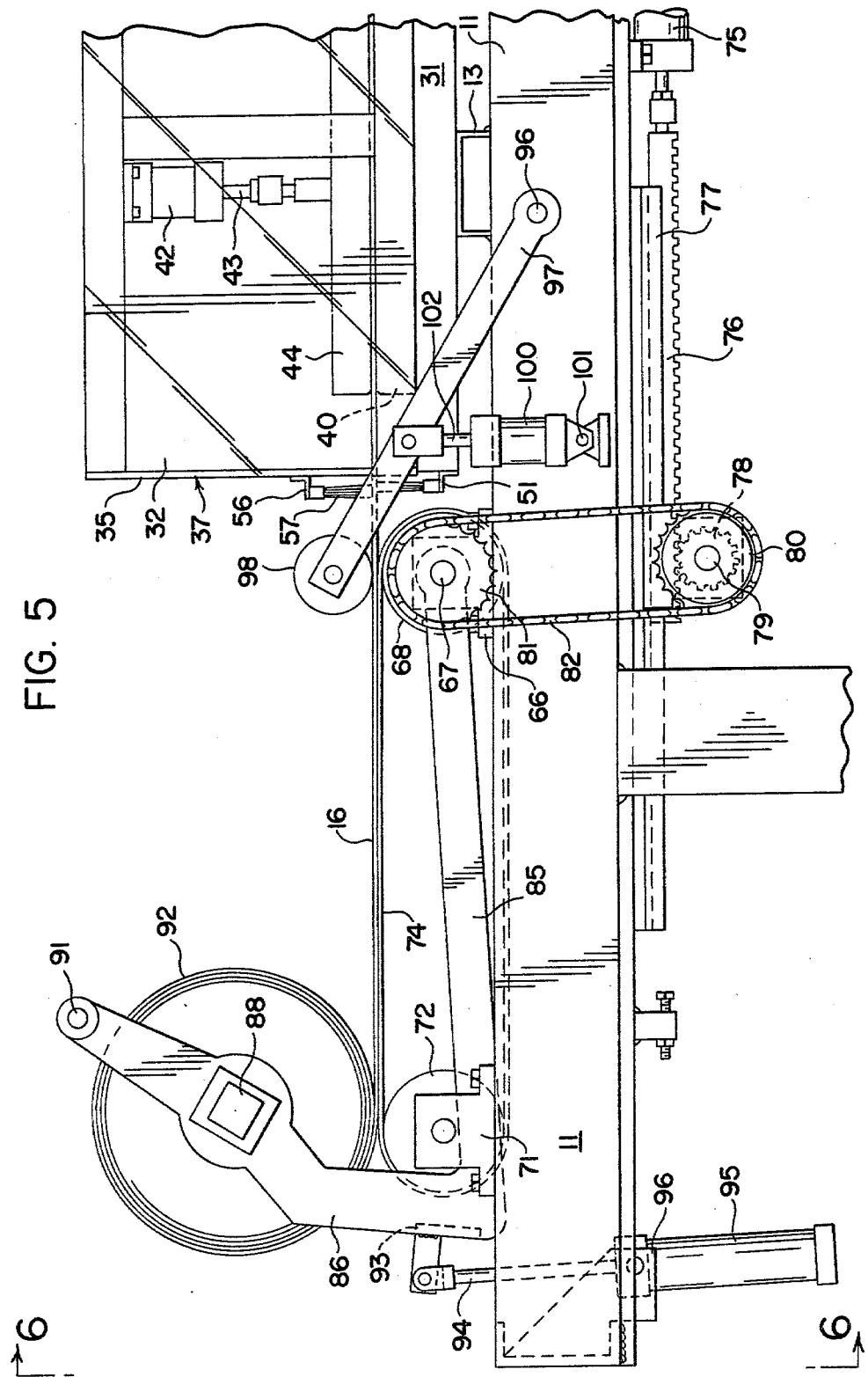
FIG. 5 is an enlarged side elevational view of the mat tester taken on line 5—5 of FIG. 2.
Figure 6:
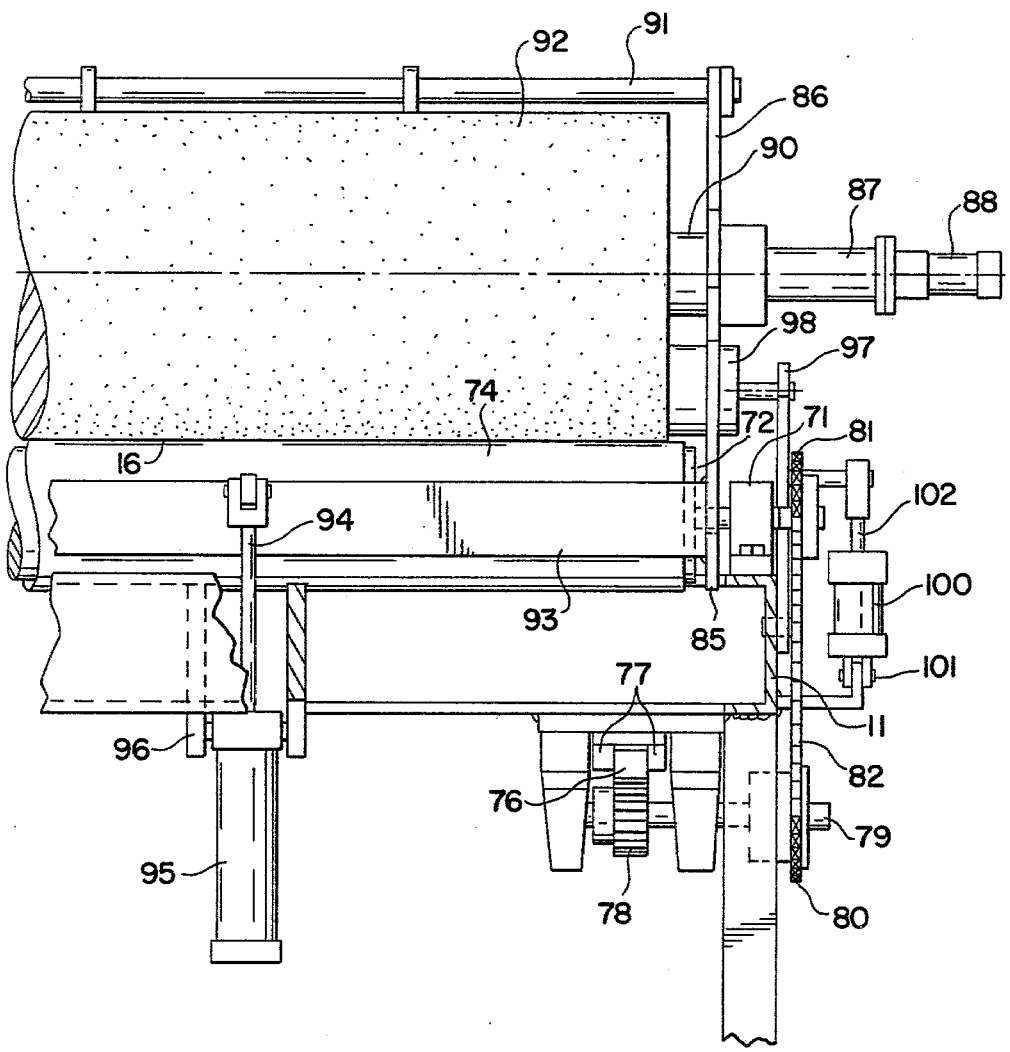
FIG. 6 is a fragmentary end view of the mat tester on line 6—6 of FIG. 5.

Suitably mounted on the bottom framework of the apparatus described is a pneumatic cylinder 75, having its output piston rod connected to a gear rack 76 guided by guideways 77. Rack 76 meshes with a gear 78 suitably journaled on shaft 79 supported by the apparatus framework. Keyed to shaft 79 is a sprocket 80 in vertical alignment with a sprocket 81 (FIG. 5) keyed to the same shaft on which roller 68 is mounted. Sprockets 80 and 81 are interconnected by a sprocket chain 82.

Journaled on shaft 67 for pivotal movement are a pair of L-shaped spaced lever arm members 85 whose leg portions 86 support a housing member 87 on which is mounted pneumatic cylinders 88 and 89 that are operative to actuate chuck means to release or mount a shaft 90 that supports a core around which the mating is wound. The respective ends of leg portions 86 are interconnected by a rod 91. The rear of leg portions 86 adjacent to lever arm members 85 is connected to a bracket 93 which in turn is connected to a piston rod 94 of pneumatic cylinder 95. Cylinder 95 is pivotally connected to braces 96 such that energization of head end of cylinder 95 pivots lever arm members 85 counterclockwise about shaft 67 as seen in FIG. 1, which lifts the matting roll 92 (FIG. 1) wound around the core on shaft 90 upwardly out of contact with the belt 74 and roller 72; whereas exhausting of the head end of cylinder 95 allows the matting being wound about the core on shaft 90 to rest on the belt 74 in contact with the roller 72. The windup of the matting onto the core on shaft 90 would automatically compensate for its increase in diameter to provide a constant peripheral speed.

Pivotally mounted as at 96 on the spaced brackets 11 adjacent to one cross channel beam 13 is a pair of spaced lever arm members 97 which support for rotation a roller 98. A pair of spaced pneumatic cylinder 100 has their respective head ends pivotally secured as at 101 to supporting brackets 11. The respective piston rods 102 of cylinder 100 are pivotally connected to the intermediate portion of lever arm members 97 for raising and lowering lever arm members 97 and idler roller 98 supported therebetween.

In the operation of the mat tester, a roll of matting on a roller is placed between rollers 21 and 22 with the leader therefrom extending over roller 15 and fed through the test chamber between platens 40 and 44, thence between rollers 68 and 98 for attachment to the core supported by the shaft 90 on leg portions 86 of arm members 85. The apparatus is now in a condition to test the insulating factor of the mat material. The head end of cylinders 42 are actuated to lower the upper platen into contact with the mat material. A voltage such as 15,000 volts A.C. is applied from a suitable source to the upper platen. If the mat material is defective a current will flow through the material to the grounded lower platen 40 which condition will be observed on the ammeter connected to the respective lower and upper platens. Where no current flow is indicated after the prescribed time lapse, the rod end of pneumatic cylinders 42 are actuated which lifts the electrode plate 44 out of contact with the matting in the test chamber, permitting its advancement such that a new section of matting is brought into position underneath the plate 44 with a slight overlap of the section already tested to assure that the entire length of matting will be tested. This is accomplished by adjusting the stroke of cylinder 75. Pneumatic cylinder 75 is then actuated to extend the piston rod and rotate gear 78, which in turn rotates sprockets 80 and 81, roller 68 and endless belt 74. The mat material resting between rollers 68 and 98 will be advanced the length of the stroke of cylinder 75. The matting as it is advanced will be wound up onto roll 92 since roll 92 is frictionally resting on roller 72, to be rotated thereby. The operation will proceed as described above until the entire roll of matting from roller 20 is expended; however, a second roll of matting is placed onto the rollers 21 and 22 and spliced to the trailing end of the prior matting roll to facilitate uninterrupted passage through the test chamber 37.

Various modifications are contemplated and may obviously be resorted to by those skilled in the art without departing from the described invention, as hereinafter defined by the appended claims, as only a preferred embodiment thereof has been disclosed.

We claim:

1. An apparatus for the testing of the electrical non-conductivity of a rubberized mat comprising support means having a forward portion and a rearward portion, a stationary flat electrode plate mounted on said support means intermediate of said forward and rearward portion, a flat moveable electrode plate in vertical alignment with said stationary plate, power operated means mounted on said support means and interconnected to said moveable plate for moving said moveable plate from a vertical storage position downwardly into a closely adjacent position to said stationary plate to provide a small gap therebetween for contact with a thin mat resting on said stationary plate, means for applying a voltage to said upper electrode plate, means on said support means for feeding mat material along the surface thereof and through said spaced electrode plates, a take-up roll mounted adjacent to said rearward portion of said support means for winding up said mat as it is advanced between said spaced electrode plates, said means for feeding said mat includes a pair of spaced rollers with an endless belt thereon, said belt having an upper conveying run and a lower return run, said conveying run being in line with the top surface of said stationary electrode plate, and power operated means connected to one of said spaced rollers for rotating said one roller a predetermined rotation to advance said mat.

2. An apparatus for the testing of the electrical non-conductivity of a rubberized mat as set forth in claim 1 wherein said take-up roll has its peripheral surface resting on the other one of said pair of spaced rollers to facilitate the wind up of matting material thereon.

3. An apparatus for the testing of the electrical non-conductivity of a rubberized mat as set forth in claim 2 wherein said electrode plates are enclosed in a transparent test box.

4. An apparatus for the testing of the electrical non-conductivity of a rubberized mat as set forth in claim 3 wherein said electrode plates have the same width and length in dimension, and said power operated means being operative to advance said mat a distance slightly less than said length of said plates to provide an overlap in the testing of said mat material.

5. An apparatus for the testing of the electrical non-conductivity of a rubberized mat as set forth in claim 4 wherein a voltage of approximately 15,000 volts A.C. is applied to said matting.

6. An apparatus for the testing of the electrical non-conductivity of a rubberized mat as set forth in claim 5 wherein said means for feeding said mat includes a pair of laterally spaced lever members pivotally mounted on said support means, an idler roller journaled on said lever arm members for rotation and being operative to rest on said one of said pair of spaced rollers for applying pressure to matting resting on said one of said pair of spaced rollers, and power actuated cylinder means mounted on said support means and operatively connected to said lever arm members for pivoting said lever arm members and said idler roller journaled thereon out of contact with said one of said pair of spaced rollers.

* * * * *